United States Patent [19]

Kato et al.

[11] Patent Number: 5,558,540
[45] Date of Patent: Sep. 24, 1996

[54] MULTI-CONNECTOR ASSEMBLY

[75] Inventors: Nobukazu Kato; Mamoru Suzuki, both of Tokyo, Japan

[73] Assignee: Japan Aviation Electronics Industry, Limited, Japan

[21] Appl. No.: 363,371

[22] Filed: Dec. 23, 1994

[30] Foreign Application Priority Data

Dec. 29, 1993 [JP] Japan .................................. 5-351540

[51] Int. Cl.⁶ .................................................. H01R 23/70
[52] U.S. Cl. ............................................................. 439/637
[58] Field of Search .................................. 439/59, 70–71, 439/637, 717, 940

[56] References Cited

U.S. PATENT DOCUMENTS

| 4,993,965 | 2/1991 | Eck | 439/374 |
| 5,076,804 | 12/1991 | Bertho et al. | 439/567 |
| 5,242,311 | 9/1993 | Seong | 439/940 |
| 5,249,977 | 10/1993 | Tanaka et al. | 439/940 |

FOREIGN PATENT DOCUMENTS 0549960  7/1993  European Pat. Off. .

Primary Examiner—P. Austin Bradley
Assistant Examiner—Jill DeMello
Attorney, Agent, or Firm—Laff, Whitesel, Conte & Saret, Ltd.

[57] ABSTRACT

A multi-connector assembly for use with a printed circuit board having a conductive pattern comprises a plurality of electrical connectors to be mounted on the printed circuit board in a predetermined positional relationship with one another. Each connector comprises an insulator block having a fitting member to be fitted in a mating connector, and a plurality of electrical contacts fixedly supported in the insulator block. Each contact has a contacting portion to be brought into contact with a corresponding contact of the mating connector and a terminal portion to be mechanically and electrically connected to the conductive pattern. Each of a plurality of connecting bar members is for mechanically connecting the connectors adjacent to one another in the predetermined positional relationship to thereby maintain the connectors in the predetermined positional relationship. A common holding member is removably connected in common to the connecting bar members and has a handle portion to be chucked by a chucking member of a conveying machine for conveying the assembly.

5 Claims, 10 Drawing Sheets

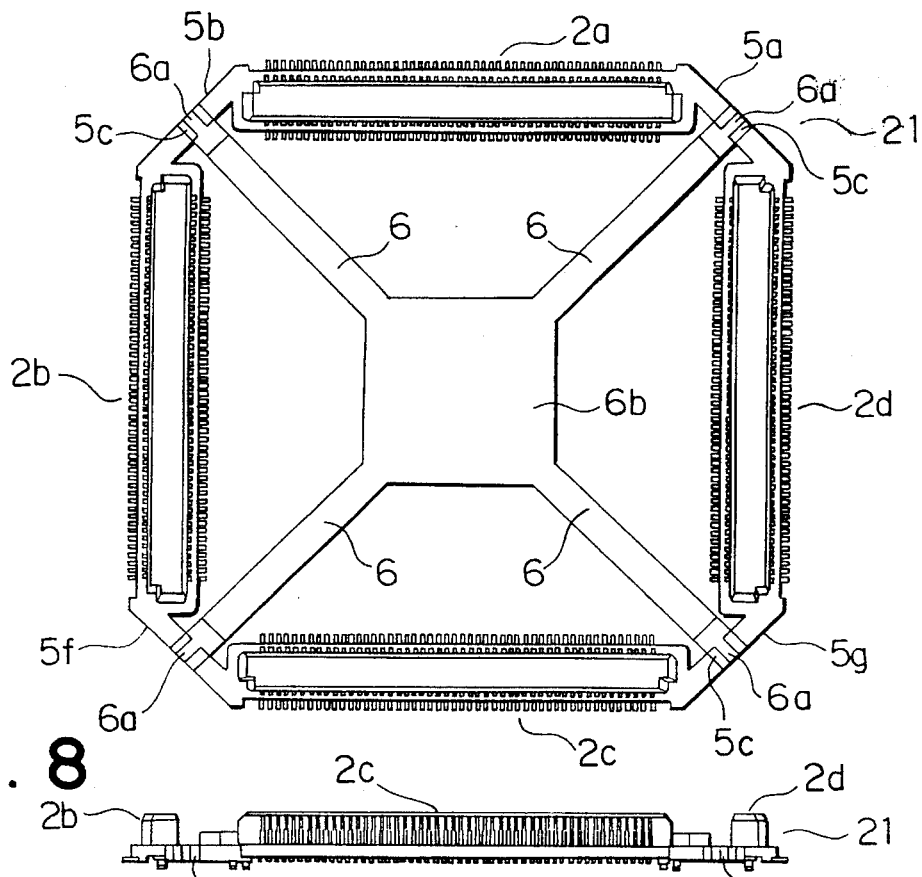
FIG. 8
FIG. 9
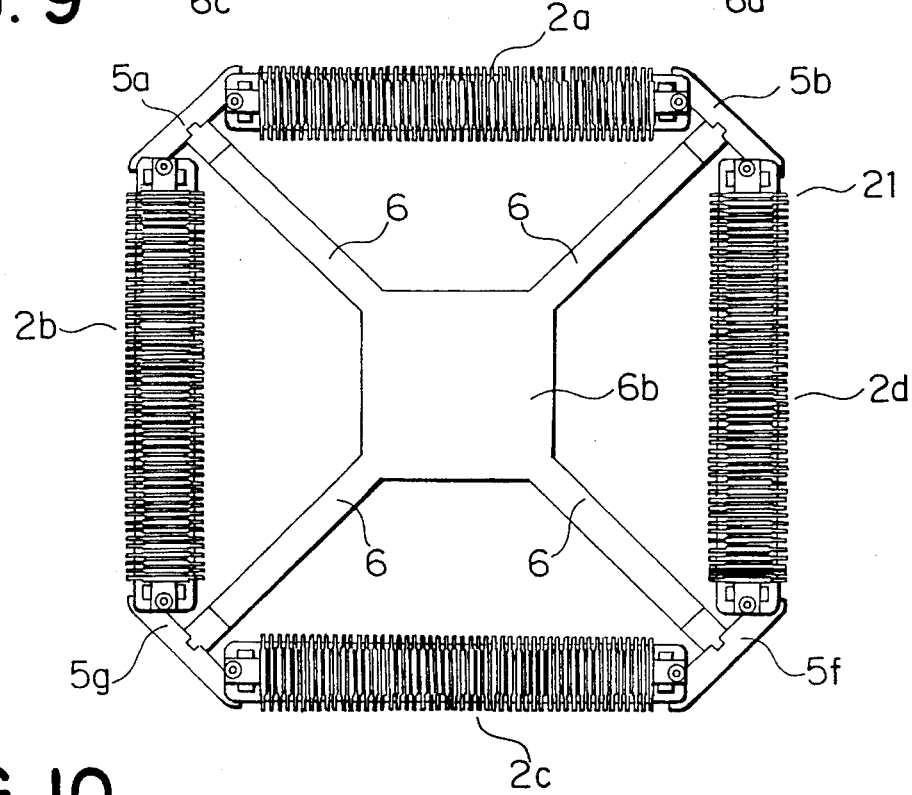
FIG. 10

5,558,540

MULTI-CONNECTOR ASSEMBLY

BACKGROUND OF THE INVENTION

This invention relates to a multi-connector assembly to be mounted on a printed circuit board and, in particular, to a multi-connector assembly which facilitates accurate positioning and soldering in a mounting operation.

A conventional connector comprises an insulator block and a plurality of electrical contacts fixedly supported in the insulator block. The insulator block comprises a base member and a fitting member protruding from the base member. The fitting member is adapted to be removably fitted in a mating fitting member of a mating connector. Each of the contacts has a terminal portion and a contacting portion disposed to the base member and the fitting member of the insulator block, respectively. The terminal portions of the contacts are for one-to-one connection to a plurality of conductive patterns formed on a printed circuit board. The contacting portions of the contacts are for one-to-one contact with mating contacting portions of the mating connector.

In order to mount the connector on the printed circuit board, the connector is conveyed by an automatic conveying machine onto the printed circuit board and located thereon so that the base member of the connector is faced to a surface of the printed circuit board with the terminal portions of the contacts being engaged with the corresponding conductive patterns on the printed circuit board. Then, the terminal portions are soldered to the conductive patterns.

Generally, a plurality of connectors are mounted on the printed circuit board. These connectors are arranged in parallel to one another at a space left from one another. Alternatively, the connectors are arranged in a single linear row.

Although the connector must be located on the printed circuit board so that the contacts of the connector are brought into contact with the corresponding conductive patterns on the printed circuit board, the located position of the connector is permitted to be distributed within a constant region or area which is small and is called an allowance. This means that a plurality of, or two connectors mounted on a common circuit board may vary in their positional relationship therebetween in each of different printed circuit boards. Therefore, a plurality of male-type connectors mounted on a first printed circuit board cannot often be well mated with a plurality of female-type connectors mounted on a second printed circuit board which is desired to be connected with the first printed circuit board, because of difference of the positional relationship between the male-type connectors and that between the female-type connectors.

When a plurality of the connectors are arranged in a single linear row, an entire length of the row of the connectors becomes extremely long. It is therefore impossible to solder the terminal portions to the conductive patterns by reflow sildering.

SUMMARY OF THE INVENTION

It is an object of this invention to provide a multi-connector assembly comprising a combination of a plurality of connectors, which facilitates accurate positioning and reflow soldering in a mounting operation of the assembly onto a printed circuit board and which achieves an improved reliability after soldering.

According to this invention, there is provided a multi-connector assembly for use with a printed circuit board having a conductive pattern formed thereon, which comprises a plurality of electrical connectors to be mounted on the printed circuit board in a predetermined positional relationship with one another, each of the connectors comprising an insulator block having a fitting member to be fitted in a mating connector, and a plurality of electrical contacts fixedly supported in the insulator block, each of the contacts having a contacting portion to be brought into contact with a mating contact of the mating connector and a terminal portion to be mechanically and electrically connected to the conductive pattern on the printed circuit board, a plurality of connecting bar members each of which is made of an insulation material, the connecting bar members being for mechanically connecting a plurality of the connectors adjacent to one another in the predetermined positional relationship to thereby maintain the connectors in the predetermined positional relationship, and a common holding member removably connected in common to a plurality of the connecting bar members, the common holding member having a handle portion to be chucked by a chucking member of a conveying machine for conveying the assembly.

According to this invention, there is also provided a multi-connector assembly as described above, wherein the insulator block has a base member integrally formed with the connecting bar members and the fitting member is formed on the base member.

According to this invention, there is also provided a multi-connector assembly as described above, wherein the connecting bar members have first engaging portions to be engaged with opposite ends of the common holding member, respectively, while the common holding member has second engaging portions to be releasably engaged with the first engaging portions.

According to this invention, there is also provided a multi-connector assembly as described above, wherein the first engaging portions are located at a level higher than that of the connecting bar members and engaged with the second engaging portions.

According to this invention, there is also provided a multi-connector assembly as described above, wherein each of the first engaging portions has a pair of protrusions upwardly protruding from each of the connecting bar members to define a first groove therebetween, and a second groove formed in each of the connecting bar members and extending from a position in the first groove in a downward direction reverse to the protrusions, each of the second engaging portions of the common holding member being adapted to be releasably engaged in the first and the second grooves.

BRIEF DESCRIPTION OF THE DRAWINGS

FIG. 8 is a plan view of a multi-connector assembly of a male type according to another embodiment which is a modification of the multi-connector assembly illustrated in FIG. 3;

FIG. 9 is a front view of the multi-connector assembly of a male type illustrated in FIG. 8;

FIG. 10 is a bottom view of the multi-connector assembly of a male type illustrated in FIG. 8;

DESCRIPTION OF THE PREFERRED EMBODIMENTS

Prior to description of embodiments of this invention, a conventional connector will at first be described with reference to FIG. 1 in order to facilitate an understanding of this invention.

Figure 1:
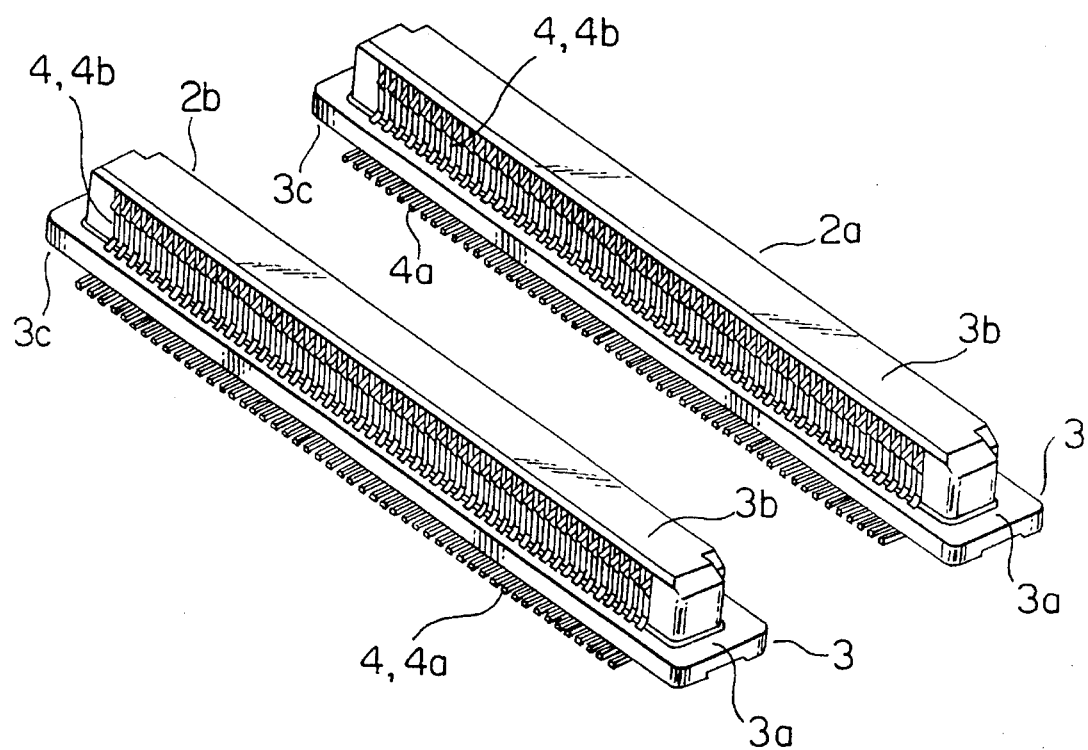
FIG. 1 is a perspective view of two conventional connectors.

FIG. 1 shows two connectors 2a and 2b to be mounted on a printed circuit board which is not illustrated in the figure. Since the connectors 2a and 2b have a similar structure, the structure will presently be described in conjunction with one connector 2a alone. The connector 2a comprises an insulator block 3 and a plurality of electrical contacts 4 fixedly supported in the insulator block 3. The insulator block 3 comprises a base member 3a of a rectangular plate, a fitting member 3b protruding from one surface, that is, an upper surface in the figure, of the base member 3a, and a mounting surface 3c which is a lower or bottom surface of the base member 3a opposite to the upper surface. The fitting member 3b is adapted to be removably fitted in a mating fitting member of a mating connector (not shown). Each of the contacts 4 has a terminal portion 4a and a contacting portion 4b disposed to the base member 3a and the fitting member 3b, respectively. The terminal portions 4a of the contacts 4 are for one-to-one connection to a plurality of conductive patterns formed on the printed circuit board (not shown).

The contacting portions 4b of the contacts 4 are for one-to-one contact with corresponding contacting portions (not shown) of the mating connector.

The terminal portions 4a and the contacting portions 4b are fixedly supported in the insulator block 3 and aligned in a longitudinal direction of the insulator block 3.

The connector 2a is conveyed by an automatic conveying machine to a position above the printed circuit board. The mounting surface 3c of the base member 3a is faced to the printed circuit board. Then, the terminal portions 4a of the contacts 4 are engaged with and soldered to the conductive patterns.

The connectors 2a and 2b are mounted on the printed circuit board in parallel to each other at a space left from each other. Alternatively, the connectors 2a and 2b are arranged in a single linear row.

Although the connector 2a must be located on the printed circuit board so that the contacts 4 of the connector 2a are brought into contact with the corresponding conductive patterns on the printed circuit board, the located position of the connector 2a is permitted to be distributed within a constant region or area which is small and is called an allowance. This means that a plurality of, or two connectors 2a and 2b mounted on a common circuit board may vary in their positional relationship therebetween in each of different printed circuit boards. Therefore, a plurality of male-type connectors mounted on a first printed circuit board cannot often be well mated with a plurality of female-type connectors mounted on a second printed circuit board which is desired to be connected with the first printed circuit board, because of difference of the positional relationship between the male-type connectors and that between the female-type connectors.

In presence of a small dislocation between the connectors 2a and 2b and the mating connectors, it is possible to couple the connectors 2a and 2b and the mating connectors if a coupling operation is forcedly carried out. However, as a result of such forced coupling between the connectors 2a and 2b and the mating connectors, the printed circuit board is deformed. In this event, the printed circuit board is warped or subjected to a stress at a soldered part.

When the connectors 2a and 2b are arranged in a single linear row in order to obtain the contacts 4 of a required number, an entire length of the linear row of the connectors 2a and 2b becomes extremely long. It is therefore impossible to automatically convey the connectors 2a and 2b and to carry out the reflow soldering.

Now, description proceeds to a multi-connector assembly according to this invention.

At first referring to FIGS. 2 through 4, a multi-connector assembly 1 of a male type will be described. The similar parts similar to those of the connectors 2a and 2b illustrated in FIG. 1 will be designated by like reference numerals.

The multi-connector assembly 1 of a male type is mounted, by the use of an automatic conveying machine, on a printed circuit board 9 having a plurality of conductive patterns 9a formed on one surface thereof. The multi-connector assembly 1 comprises two electrical connectors 2a and 2b to be mounted on the printed circuit board 9 in a predetermined positional relationship with each other.

Each of the connectors 2a and 2b includes an insulator block 3 and a plurality of electrical contacts 4 fixedly supported by the insulator block 3. The insulator block 3 has a base member 3a, a fitting member 3b protruding from one surface of the base member 3a to be coupled to a mating connector (not shown), and a mounting surface 3c of the base member 3a opposite to the one surface. Each of the contact 4 has a terminal portion 4a to be mechanically and electrically connected to a corresponding one of the conductive patterns 9a of the printed circuit board 9, and a contacting portion 4b to be brought into contact with a corresponding contact of the mating connector.

The terminal portions 4a and the contacting portions 4b of the contacts 4 are fixedly supported in the insulator block 3 and aligned in a longitudinal direction of the insulator block 3.

In a mounting operation, the mounting surface 3c of each of the connectors 2a and 2b is faced to the printed circuit board 9. Then, the terminal portions 4a are engaged with and then soldered to the conductive patterns 9a for connection therebetween.

The multi-connector assembly 1 has two connecting bar members 5a and 5b. Each of the connecting bar members 5a and 5b is made of an insulating material. The connecting bar members 5a and 5b serve to mechanically connect the connectors 2a and 2b adjacent to each other in the predetermined positional relationship to thereby maintain the connectors 2a and 2b in the predetermined positional relationship, which is shown as a parallel relationship in the figure.

The multi-connector assembly 1 further has a single common holding member 6 bridging a distance between the opposite connecting bar members 5a and 5b and removably connected to the connecting bar members 5a and 5b. The common holding member 6 has a handle portion 6b formed at its center to be chucked by a chucking member 10 of the automatic conveying machine for conveying the multi-connector assembly 1. The handle portion 6b has a width greater than that of the common holding member 6 in a direction perpendicular to a longitudinal direction of the common holding member 6. The handle portion 6b is chucked by the chucking member 10 and the multi-connector assembly 1 is conveyed to a position above the printed circuit board 9. In this embodiment, the upper surface of the handle portion 6b is chucked by an attractive force of the chucking member 10.

The base member 3a of the insulator block 3 is a rectangular plate integrally formed with the connecting bar members 5a and 5b. The fitting member 3b is formed on the base member 3a. Each of the connecting bar members 5a and 5b is connected to both of the base members 3a of the connectors 2a and 2b.

The connecting bar members 5a and 5b have first engaging portions 5c to be engaged with opposite ends of the common holding member 6. The common holding member 6 has second engaging portions 6a to be releasably engaged with the first engaging portions 5c. Each of the first engaging portions 5c has a pair of protrusions 5y upwardly protruding from each of the connecting bar members 5a and 5b to define a first groove 5z therebetween, and a second groove 5w formed in each of the connecting bar members 5a and 5b and extending from a position in the first groove 5z in a downward direction reverse to the protrusions. The second engaging portions 6a of the common holding member 6 are removably coupled in the first and the second grooves 5z and 5w.

In the multi-connector assembly 1, the common holding member 6 engaged with the connecting bar members 5a and 5b is chucked by the automatic conveying machine and the connectors 2a and 2b are conveyed onto the printed circuit board 9 at one time. At this time, the common holding member 6 is engaged with the connecting bar members 5a and 5b by an appropriate engaging force. Accordingly, the common holding member 6 is not released from the connecting bar members 5a and 5b while the connectors 2a and 2b are conveyed. The common holding member 6 can be removed from the connecting bar members 5a and 5b after the terminal portions 4a and the conductive patterns 9a are soldered together.

Accordingly, a combination of the connecting bar members 5a and 5b, which couple the connectors 2a and 2b, and the common holding member 6 serves to prevent dislocation between the connectors 2a and 2b during the reflow soldering. After the terminal portions 4a and the conductive patterns 9a are soldered together, it is possible to examine and repair the soldered part of the terminal portions 4a by removing the common holding member 6 from the multi-connector assembly 1.

Figure 2:
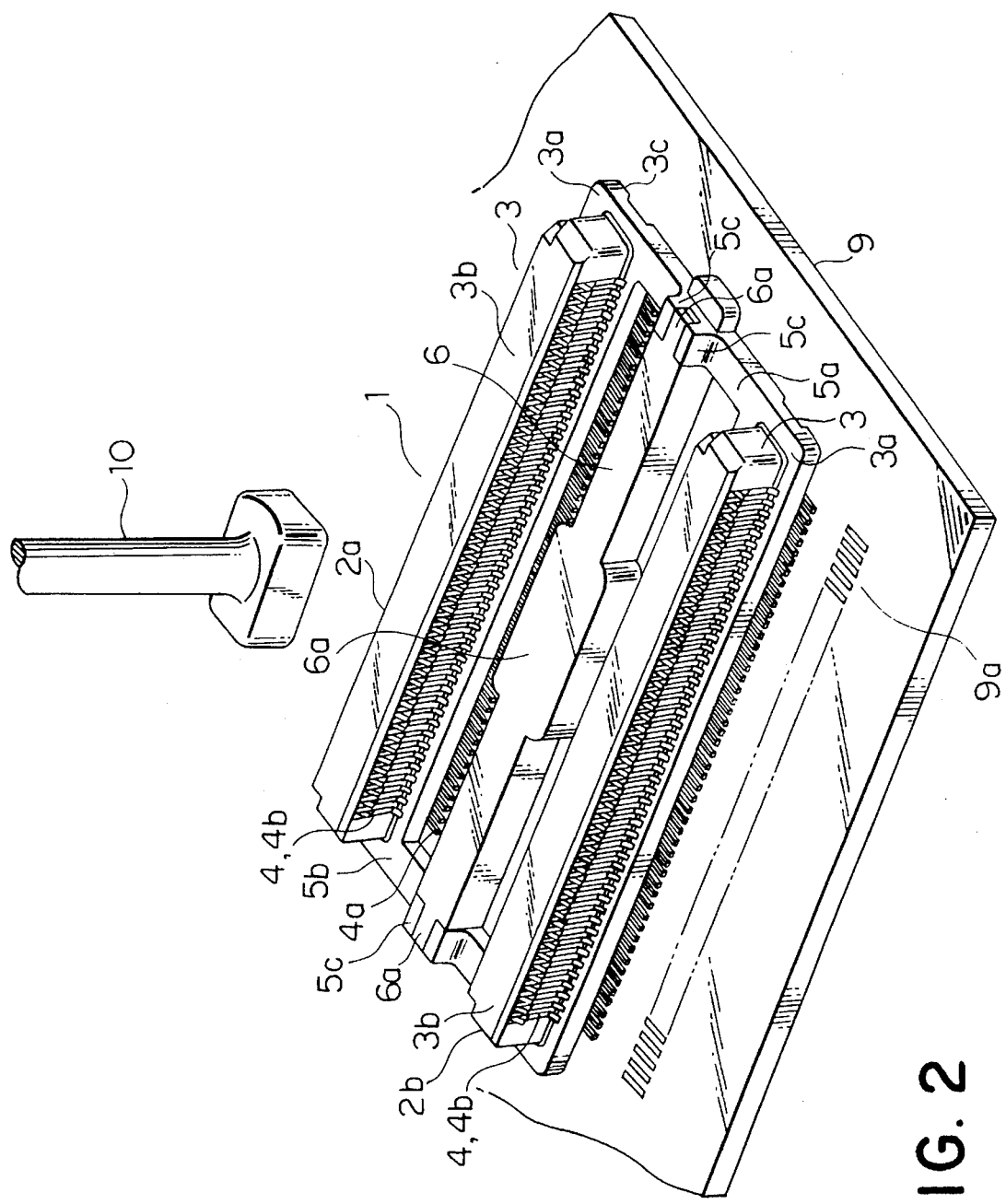
FIG. 2 is a perspective view of a multi-connector assembly of a male type according to one embodiment of this invention when it is conveyed to a position above a printed circuit board.
Figure 3:
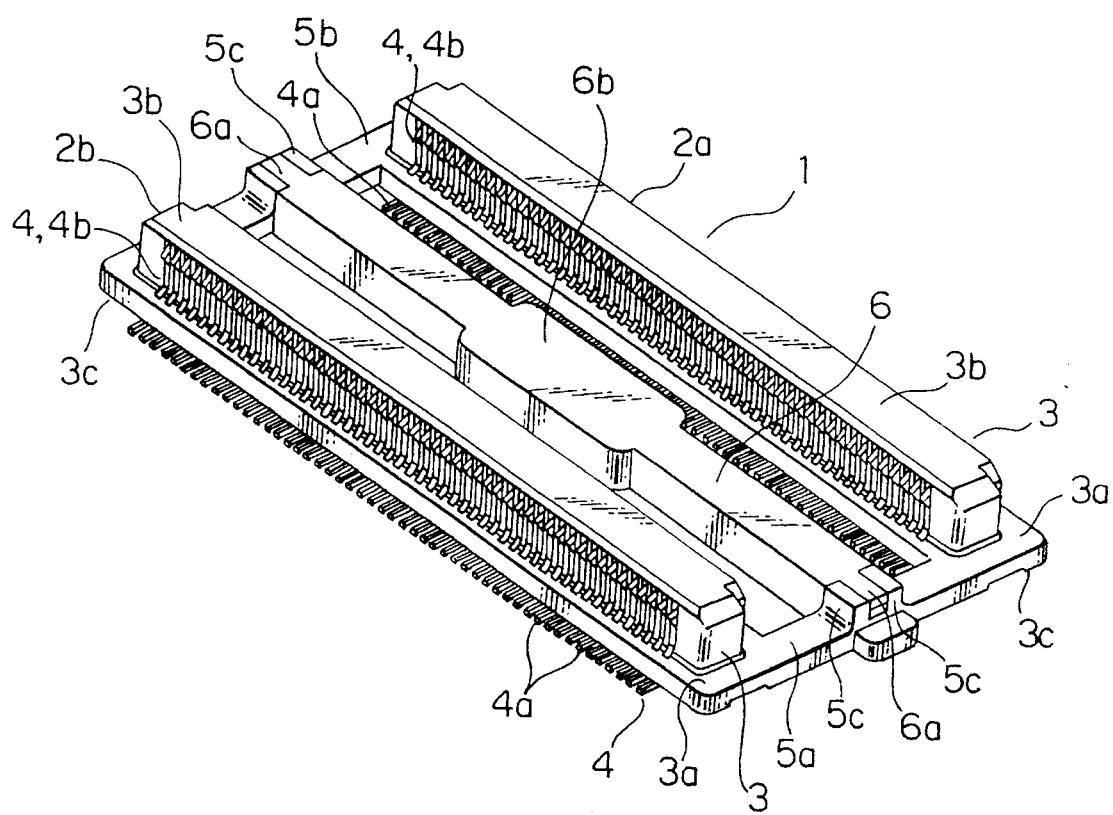
FIG. 3 is a perspective view of the multi-connector assembly of a male type illustrated in FIG. 2.
Figure 4:
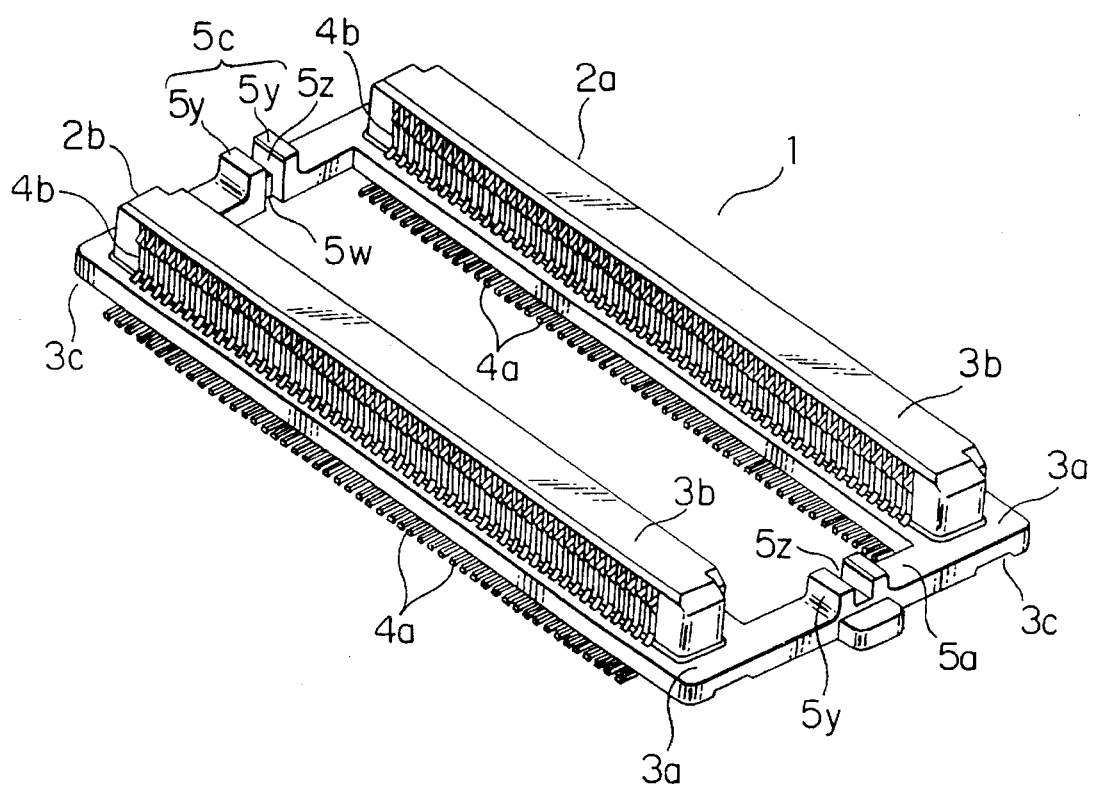
FIG. 4 is a perspective view of the multi-connector assembly of a male type illustrated in FIG. 3 from which a common holding member is removed.

The multi-connector assembly 1 illustrated in FIGS. 2 through 4 is of a male type in which the fitting members 3b protrude from the base members 3a. As mating connectors to be coupled to the fitting members 3b of the multi-connector assembly 1, use is made of a multi-connector assembly 11 of a female type illustrated in FIGS. 5 and 6.

The female-type multi-connector assembly 11 comprises two female connectors 12a and 12b fitted in one-to-one correspondence to the fitting members 3b of the male connectors 2a and 2b.

Each of the connectors 12a and 12b has an insulator block 13 and a plurality of electrical contacts 14 fixedly supported in the insulator block 13. The insulator block 13 has a base member 13a of a rectangular plate, a fitting member 13b protruding from an upper surface of the base member 13a, and a mounting surface 13c of the base member 13a which is opposite to the upper surface. The fitting member 13b is provided with a large hole for receiving and mating the fitting member 3b illustrated in FIGS. 2 through 4. Each of the contacts 14 has a terminal portion 14a and a contacting portion 14b at the base member 13a and the fitting member 13b, respectively. The terminal portions 14a of the contacts 14 are for one-to-one connection with electroconductive patterns formed on a printed circuit board (having a structure similar to that of the printed circuit board illustrated in FIG. 2) for mounting the connectors 12a and 12b. The contacting portions 14b of the contacts 14 are for one-to-one contact with the contacting portions 4b of the male-type multi-connector assembly 1.

The terminal portions 14a and the contacting portions 14b are aligned in a longitudinal direction of the insulator block 13. In order to mount the connectors 12a and 12b on the printed circuit board, the mounting surface 13c of the base member 13a is faced to the conductive patterns on the printed circuit board. Then, the terminal portions 14a and the conductive patterns are engaged with and then soldered to each other.

Two connecting bar members 15a and 15b have first engaging portions 15c, two in number, to be engaged with opposite ends of a common holding member 16. The common holding member 16 has second engaging portions 16a to be removably coupled to the first engaging portions 15c.

Each of the first engaging portions 15c has a pair of protrusions 15y upwardly protruding from each of the connecting bar members 15a and 15b to define a first groove 15z therebetween, and a second groove 15w formed in each of the connecting bar members 15a and 15b and extending in a downward direction reverse to the protrusions from a position in the first groove 15z. The second engaging portions 16a of the common holding member 16 are removably coupled in the first and the second grooves 15z and 15w.

The common holding member 16 engaged with the connecting bar members 15a and 15b is chucked by the automatic conveying machine and the connectors 12a and 12b are conveyed onto the printed circuit board at one time. At this time, the common holding member 16 is engaged with the connecting bar members 15a and 15b by an appropriate engaging force. Accordingly, the common holding member 16 is not released from the connecting bar members 15a and 15b during the mounting operation. The common holding member 16 can be removed from the connecting bar members 15a and 15b after the female-type multi-connector assembly 11 is conveyed onto the printed circuit board and the terminal portions 14a and the conductive patterns are soldered together.

Accordingly, the connecting bar members 15a and 15b connecting the connectors 12a and 12b serve to prevent dislocation between the connectors 15a and 15b during the reflow soldering.

After the terminal portions 14a and the conductive patterns are soldered together, it is possible to examine and repair the soldered part of the terminal portions 14a by removing the common holding member 16 from the female-type multi-connector assembly 11.

Figure 7:
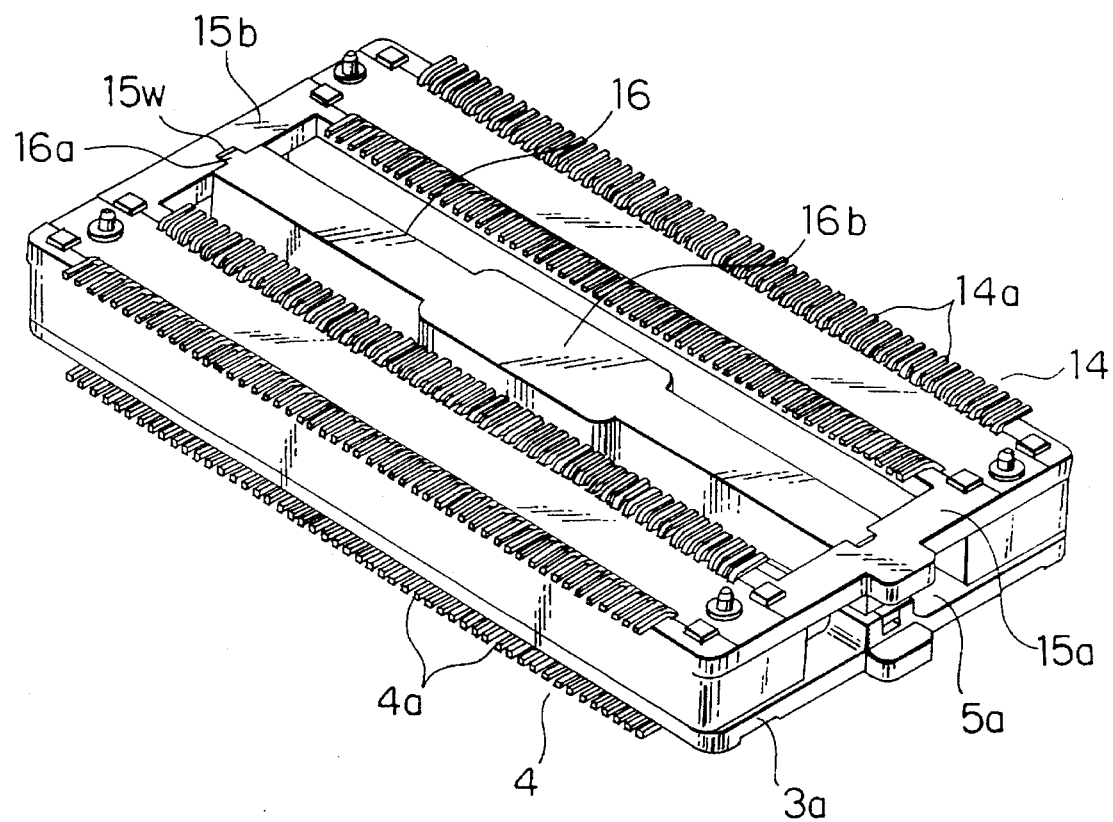
FIG. 7 is a perspective view of the multi-connector assembly of a male type illustrated in FIG. 3 and the multi-connector assembly of a female type illustrated in FIG. 5 when they are coupled to each other.

As illustrated in FIG. 7, the male-type multi-connector assembly 1 and the female-type multi-connector assembly 11 are coupled to each other in a plug-and-receptacle connection relationship after they are fixed to individual printed circuit boards which are not shown in the figure. Thus, electronic circuits formed on the printed circuit boards are connected to each other.

Referring to FIGS. 8, 9, and 10, a multi-connector assembly 21 according to another embodiment is a modification of the multi-connector assembly 1 of a male type illustrated in FIG. 3. The multi-connector assembly 21 comprises, in addition to two connectors 2a and 2b in FIG. 3, two further connectors 2c and 2d. These four connectors 2a, 2b, 2c, and 2d are arranged to form a generally rectangular shape.

In order to facilitate an understanding of this embodiment, description will be made with reference to the multi-connector assembly 1 of a male type illustrated in FIG. 3. The components similar to those of the multi-connector assembly 1 in FIG. 3 are designated by like reference numerals and description thereof will partially be omitted.

The connectors 2a, 2b, 2c, and 2d are coupled to one another through four connecting bar members 5a, 5b, 5f, and 5g. Intermediate portions of the connecting bar members 5a, 5b, 5f, and 5g are connected to a single common holding member 6 comprising four bar elements integrally formed. Each of the connecting bar members 5a, 5b, 5f, and 5g has, at its intermediate portion, a first engaging portion 5c similar to the first engaging portion 5c of each of the connecting bar members 5a and 5b in FIG. 3. The common holding member 6 has second engaging portions 6a to be engaged with the first engaging portions 5c. The common holding member 6 has, at its center portion, a handle portion 6b for conveying the connectors 2a, 2b, 2c, and 2d.

The engaging structure of the first engaging portions 5c and the second engaging portions 6a is similar to that in the multi-connector assembly 1 illustrated in FIG. 3. Accordingly, description thereof is omitted. The multi-connector assembly 21 is conveyed onto the printed circuit board by chucking the handle portion 6b in the manner similar to the multi-connector assembly 1 illustrated in FIG. 2.

Figure 5:
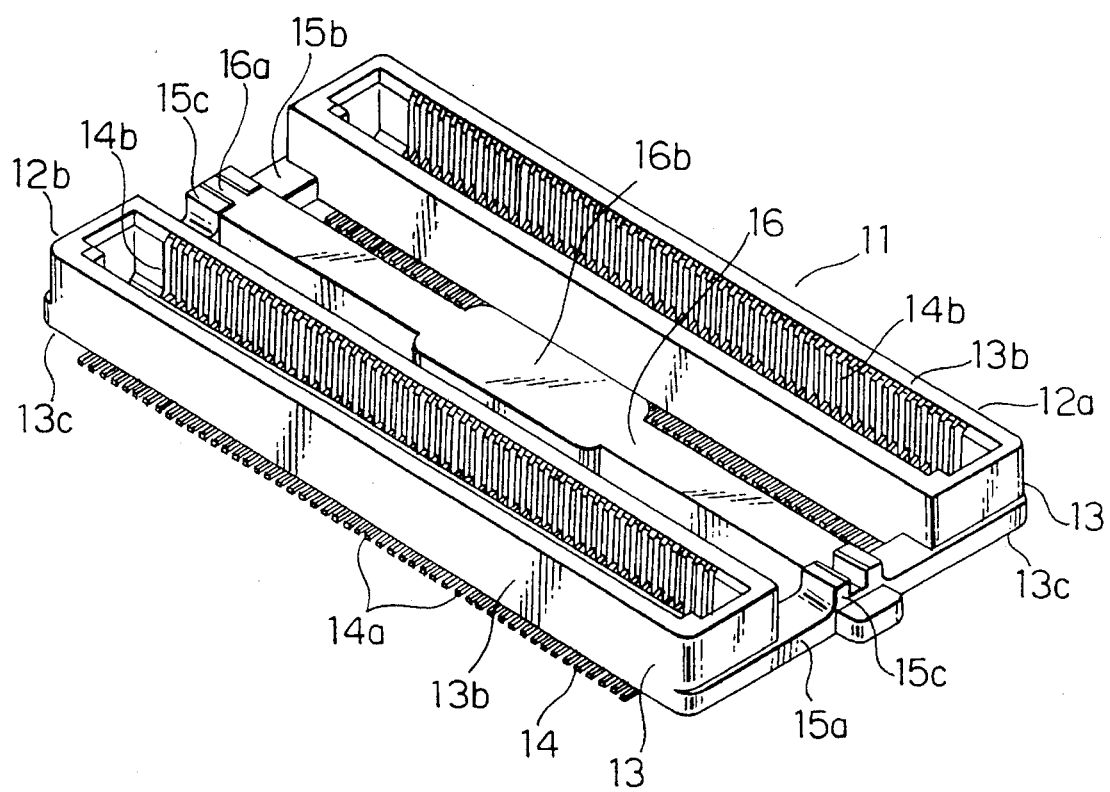
FIG. 5 is a perspective view of a multi-connector assembly of a female type according to one embodiment of this invention which is used as a mating multi-connector assembly of the assembly shown in FIGS. 2 through 4.
Figure 6:
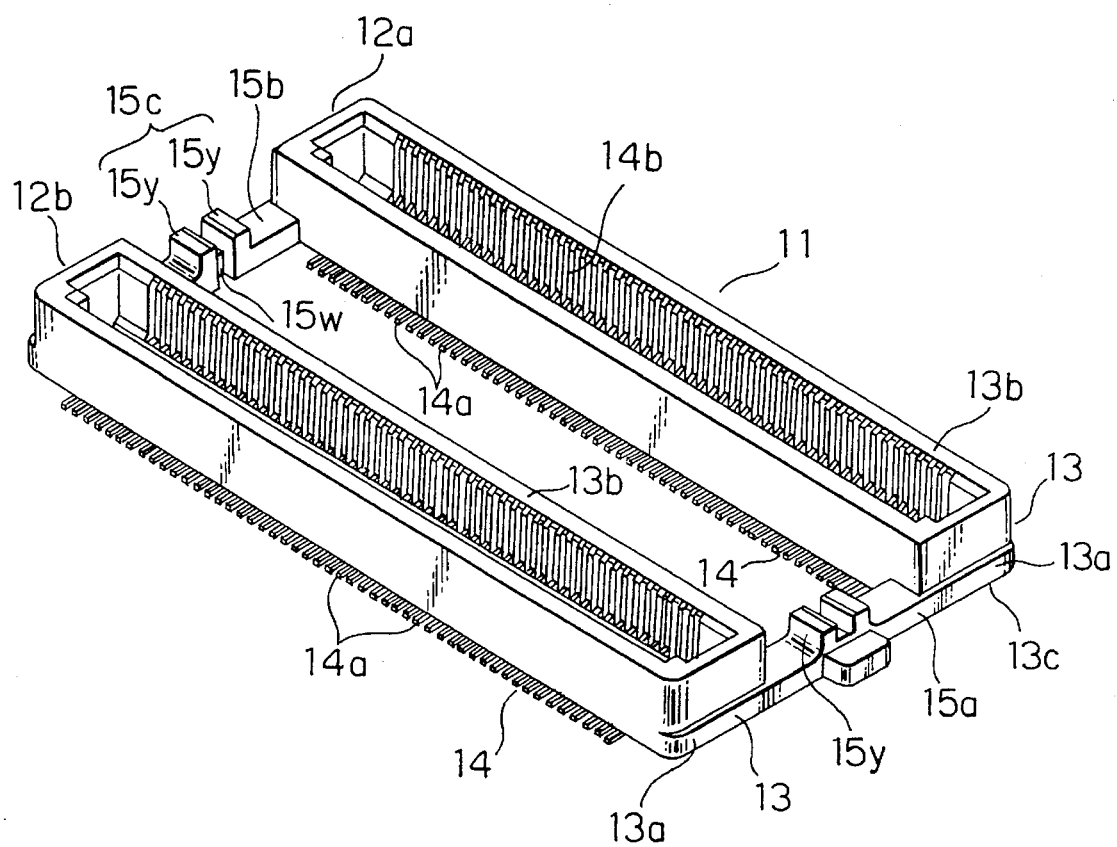
FIG. 6 is a perspective view of the multi-connector assembly of a female type illustrated in FIG. 5 from which a common holding member is removed.
Figure 11:
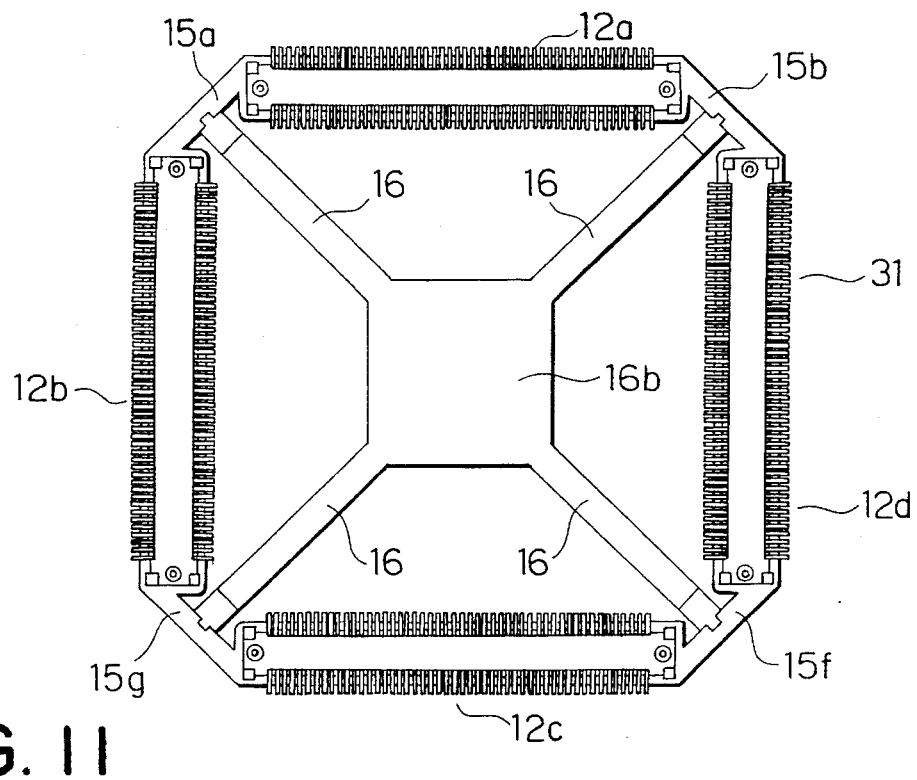
FIG. 11 is a bottom view of a multi-connector assembly of a female type according to another embodiment which is a modification of the multi-connector assembly illustrated in FIG. 5 and is used as a mating assembly of the assembly shown in FIGS. 8 through 10.
Figure 12:
FIG. 12 is a front view of the multi-connector assembly of a female type illustrated in FIG. 11.
Figure 13:
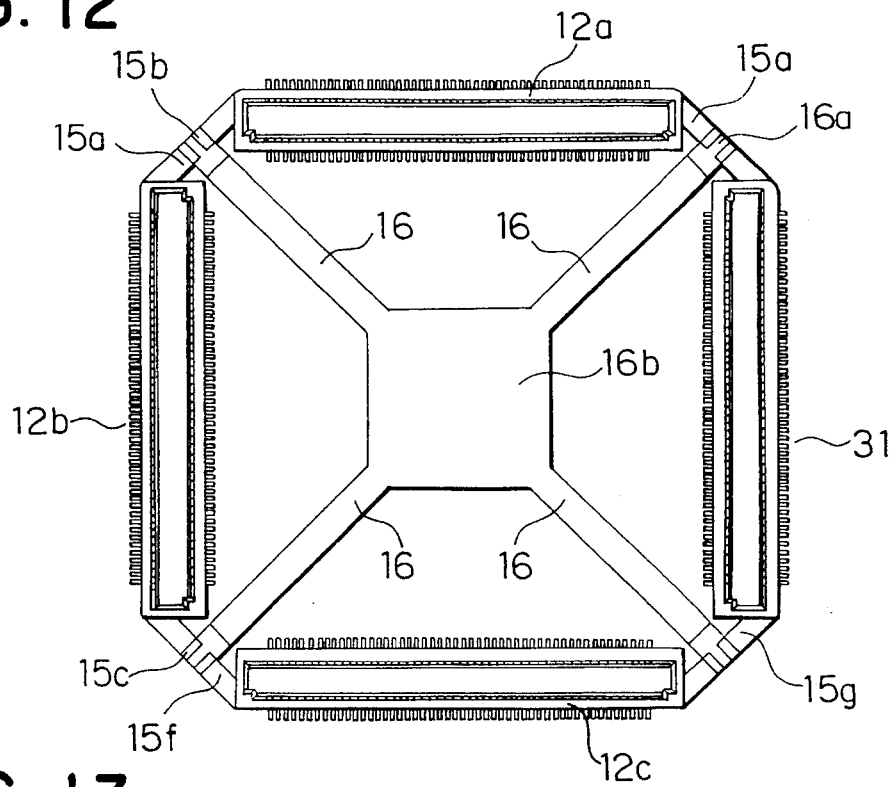
FIG. 13 is a plan view of the multi-connector assembly of a female type illustrated in FIG. 11.
Figure 14:
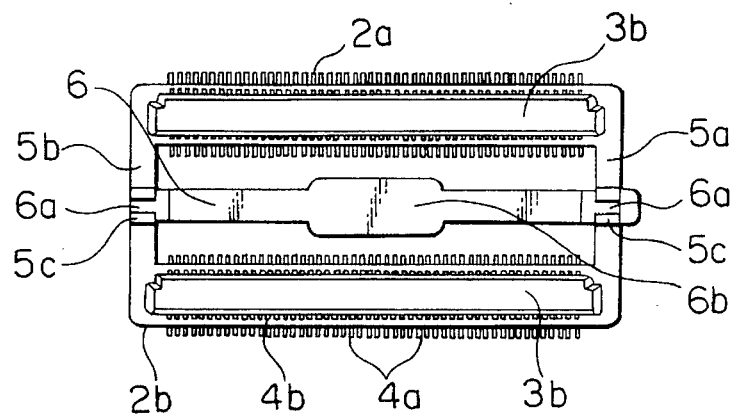
FIG. 14 is a plan view of a multi-connector assembly of a male type which is another modification of the multi-connector assembly illustrated in FIG. 3.
Figure 15:
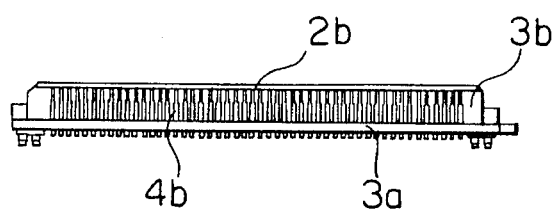
FIG. 15 is a front view of the multi-connector assembly of a male type illustrated in FIG. 14.
Figure 16:
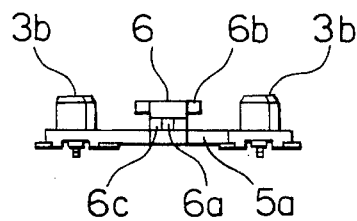
FIG. 16 is a side view of the multi-connector assembly of a male type illustrated in FIG. 14.
Figure 17:
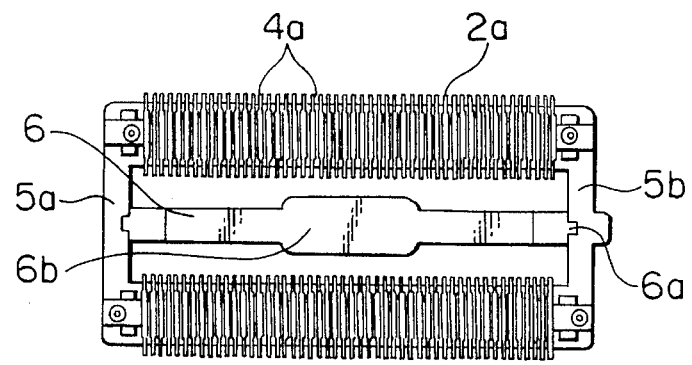
FIG. 17 is a bottom view of the multi-connector assembly of a male type illustrated in FIG. 14.

Referring to FIGS. 11, 12, and 13, a multi-connector assembly 31 of a female type according to another embodiment is a modification of the female-type multi-connector assembly 11 illustrated in FIG. 5 and is used as a mating multi-connector assembly of the male-type assembly shown in FIGS. 8 through 10. The female-type multi-connector assembly 31 comprises, in addition to two female-type connectors 12a and 12b in FIG. 5, two further female-type connectors 12c and 12d. These four female-type connectors 12a, 12b, 12c, and 12d forms a generally rectangular shape.

In order to facilitate an understanding of this embodiment, description will be made with reference to the multi-connector assembly 11 of a female type illustrated in FIG. 5. The components similar to those of the multi-connector assembly 11 of a female type in FIG. 5 are designated by like reference numerals and description thereof will partially be omitted.

The connectors 12a, 12b, 12c, and 12d are coupled through four connecting bar members 15a, 15b, 15f, and 15g. Intermediate portions of the connecting bar members 15a, 15b, 15f, and 15g are connected to a single common holding member 16 comprising four bar elements integrally formed. Each of the connecting bar members 15a, 15b, 15f, and 15g has, at its intermediate portion, a first engaging portion 15c similar to the first engaging portion 15c of each of the connecting bar members 15a and 15b in FIG. 5. The common holding member 16 has second engaging portions 16a to be engaged with the first engaging portions 15c. The common holding member 16 has a handle portion 16b at its center portion where the four bar elements are integrally connected.

The engaging structure of the first engaging portions 15c and the second engaging portions 16a is similar to that in the multi-connector assembly 11 illustrated in FIG. 5. Accordingly, description thereof is omitted. The multi-connector assembly 31 is conveyed onto the printed circuit board by a chucking member 10 for chucking the handle portion 6b in the manner similar to the multi-connector assembly 1 illustrated in FIG. 2.

The multi-connector assembly 21 of a male type of FIGS. 8 through 10 and the mating multi-connector assembly 31 of a female type of FIGS. 11 through 18 are individually chucked by the automatic conveying machine and are mounted on individual printed circuit boards. When the multi-connector assembly 21 and the mating multi-connector assembly 31 are coupled to each other, electronic circuits formed on the printed circuit boards are connected to each other.

FIGS. 14, 15, 16, and 17 shows another modification of the multi-connector assembly 1 illustrated in FIG. 3. Portions similar to those in FIG. 3 are denoted by the same reference symbols and detailed description is omitted thereto. This embodiment is different from that in FIG. 3 in that a common holding member 6 is positioned at a level higher than that of connecting bar members 5a and 5b. Specifically, first engaging portions 5c are located above the connecting bar members 5a and 5b and engaged with second engaging portions 6a.

With this structure, a large space is formed between the printed circuit board and the common holding member 6. Accordingly, it is possible to mount various parts such as electronic parts on the printed circuit board 9 at an area below the common holding member 6. The above-mentioned structure is also applicable to the multi-connector assembly 11 of a female type in FIG. 5, the multi-connector assembly 21 of a male type in FIG. 8, and the multi-connector assembly 31 of a female type in FIG. 13.

With the multi-connector assemblies 1, 11, 21, and 31, it is possible to avoid dislocation of connectors during the reflow soldering by the use of the connecting bar members 5a, 5b, 15a through 15g for coupling the connectors 2a through 2d or the connectors 12a through 12d. Coupling of the connectors 2a through 2d and the connectors 12a through 12d is assured collectively in such an assembling structure.

Conveying by the automatic conveying machine is enabled by the common holding members 6 and 16 engaged with the connecting bar members 5a, 5b, 15a, 15b, 15f, and 15g.

What is claimed is:

1. A multi-connector assembly for use with a printed circuit board having a conductive pattern formed thereon, which comprises:

a plurality of electrical connectors to be mounted on said printed circuit board in a predetermined positional relationship with one another, each of said connectors comprising an insulator block having a fitting member to be fitted in a mating connector, and a plurality of electrical contacts fixedly supported in said insulator block, each of said contacts having a contacting portion to be brought into contact with a mating contact of said mating connector and a terminal portion to be mechanically and electrically connected to said conductive pattern on said printed circuit board;

a plurality of connecting bar means each of which is made of an insulation material, said connecting bar means mechanically connecting a plurality of the connectors adjacent to one another in said predetermined positional relationship to thereby maintain said connectors in said predetermined positional relationship; and common holding means removably connected in common to a plurality of said connecting bar means, said common holding means having a handle portion to be chucked by chucking means of a conveying machine for conveying said assembly.

2. A multi-connector assembly as claimed in claim 1, wherein said insulator block has a base member integrally formed with said connecting bar members and said fitting member is formed on said base member.

3. A multi-connector assembly as claimed in claim 2, wherein said connecting bar members have first engaging portions to be engaged with opposite ends of said common holding member, respectively, while said common holding member has second engaging portions to be releasably engaged with said first engaging portions.

4. A multi-connector assembly as claimed in claim 3, wherein said first engaging portions are located at a level higher than that of said connecting bar members and engaged with said second engaging portions.

5. A multi-connector assembly as claimed in claim 4, wherein each of said first engaging portions has a pair of protrusions upwardly protruding from each of said connecting bar members to define a first groove therebetween, and a second groove formed in each of said connecting bar members and extending from a position in said first groove in a downward direction reverse to said protrusions, each of said second engaging portions of said common holding member being adapted to be releasably engaged in said first and said second grooves.

* * * * *